US010185009B2

(12) United States Patent
Keil

(10) Patent No.: US 10,185,009 B2
(45) Date of Patent: Jan. 22, 2019

(54) MAGNETIC RESONANCE SYSTEM AND OPERATING METHOD THEREFOR

(71) Applicant: Siemens Aktiengesellschaft, Munich (DE)

(72) Inventor: Miriam Keil, Erlangen-Dechsendorf (DE)

(73) Assignee: Siemens Aktiengesellschaft, Munich (DE)

( * ) Notice: Subject to any disclaimer, the term of this patent is extended or adjusted under 35 U.S.C. 154(b) by 701 days.

(21) Appl. No.: 14/742,905

(22) Filed: Jun. 18, 2015

(65) Prior Publication Data
US 2015/0369897 A1 Dec. 24, 2015

(30) Foreign Application Priority Data
Jun. 18, 2014 (DE) .................. 10 2014 211 686

(51) Int. Cl.
*A61B 5/055* (2006.01)
*G01R 33/54* (2006.01)
*G01R 33/36* (2006.01)

(52) U.S. Cl.
CPC ............ *G01R 33/546* (2013.01); *G01R 33/36* (2013.01)

(58) Field of Classification Search
CPC ..... A61B 8/5207; A61B 5/055; A61B 8/5223; A61B 8/4494; A61B 8/485; A61B 8/488; A61B 8/463; A61B 8/54
USPC ....... 324/260, 307, 318, 321, 322, 309, 313, 324/754.31; 600/407–423, 425, 427, 600/430–476
See application file for complete search history.

(56) References Cited

U.S. PATENT DOCUMENTS

| | | | |
|---|---|---|---|
| 6,356,780 B1 * | 3/2002 | Licato | A61B 5/055 600/407 |
| 2003/0184292 A1 | 10/2003 | Meyer et al. | |
| 2009/0216110 A1 * | 8/2009 | Piron | G01R 33/36 600/415 |
| 2010/0102817 A1 * | 4/2010 | Saha | G01R 33/34046 324/318 |
| 2012/0190962 A1 | 7/2012 | Glaser-Seidnitzer et al. | |
| 2014/0285192 A1 * | 9/2014 | Kalechofsky | G01R 33/561 324/309 |
| 2016/0139218 A1 * | 5/2016 | Possanzini | G01R 33/288 324/321 |
| 2016/0198997 A1 * | 7/2016 | Krishnakumar | A61N 7/02 601/2 |

(Continued)

FOREIGN PATENT DOCUMENTS

| | | | |
|---|---|---|---|
| DE | 102007011145 A1 * | 4/2008 | ......... G01R 33/341 |
| DE | 102007011145 A1 | 4/2008 | |

*Primary Examiner* — Patrick Assouad
*Assistant Examiner* — Taqi Nasir
(74) *Attorney, Agent, or Firm* — Schiff Hardin LLP

(57) ABSTRACT

In a magnetic resonance (MR) apparatus and an operating method therefor, the scanner of the MR apparatus has at least one connector for connecting a radio-frequency coil, as well as a control computer with a display screen. Connection of a radio-frequency coil to the connector causes at least one item of coil identification information, and selection of at least one measurement protocol from among a number of measurement protocols for recording magnetic resonance signals with the connected coil to be made by the control computer as a function of the at least one item of coil identification information.

17 Claims, 3 Drawing Sheets

(56) References Cited

U.S. PATENT DOCUMENTS

2016/0252596 A1\* 9/2016 Nielsen ............... G01R 33/482
324/309

\* cited by examiner

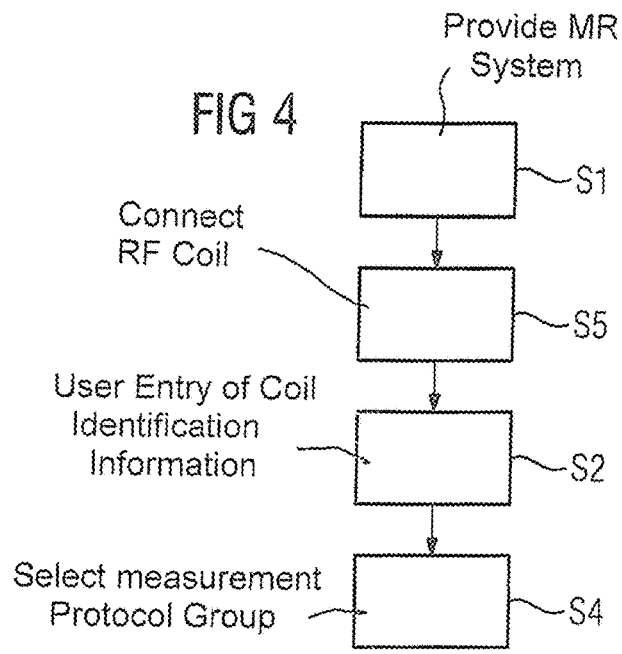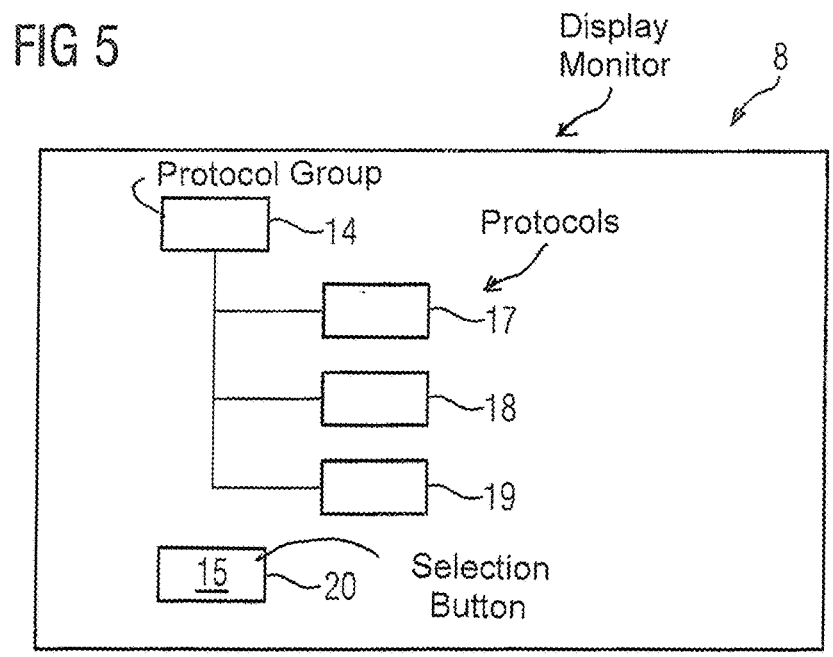

MAGNETIC RESONANCE SYSTEM AND OPERATING METHOD THEREFOR

BACKGROUND OF THE INVENTION

Field of the Invention

For a magnetic resonance examination, a patient is positioned on a patient table, the preferred coils for the examination, for example a knee coil or a head coil, are connected to the magnetic resonance system, and then the patient is moved into the examination space of the magnetic resonance system. Then adjustment measurements, such as determining the resonant frequency and setting the shim coils, are undertaken.

Description of the Prior Art

After all preparations have been carried out, the actual measurements can be performed. Measurement protocols are used for this purpose. A measurement protocol is a measurement (data acquisition) sequence with preset parameters, with the presetting being adapted for specific examinations.

Such a known protocol, for example, is a Breast_Muco_SF measurement protocol. This involves a FLASH-based T1 sequence with minimal echo times. Further settings such as the FoV are adapted to a surface coil, which is what the abbreviation "SF" for surface coil refers to. The repetition times on the other hand are tailored so that for breast measurements a maximum contrast is produced between tissue and an implant.

Similarly, there is a Breast_Cancer_CA measurement protocol for breast examination with a coil array ("coil array" CA), of which the measurement parameters are set for a maximum contrast for breast cancer.

Thus, for different coil types and medical problems there are pre-prepared measurement protocols. Over the years their number has risen to an enormous level, since there are ever more new methods for specific problems and old measurement protocols do not become obsolete, solely because comparability with earlier measurements is often to be retained.

In order to make it easier to find measurement protocols, it is known to present measurement protocols in tree views. In such cases, the first lower branches can be anatomically organized, for example "head", "breast", etc. then there is a subdivision according to medical problems such as "stroke", "cancer", etc. At the end a further distinction is made according to measurement sequences, examples for this are "FLASH", "Spinecho", "T1-Spinecho", "T2*-FLASH", etc. A measurement sequence is thus a predetermined sequence of radio frequency pulses, gradients, waiting times and acquisition windows, which are used for recording measurement signals, in order to create from the measurement signals one or more images, spectra or a parameter map.

In such cases, it is a problem that searching for the correct measurement protocol is time-consuming and to some extent susceptible to errors. At least a certain level of prior knowledge is required from the user.

SUMMARY OF THE INVENTION

An object of the present invention is to provide a method for operating a magnetic resonance system that is less susceptible to errors.

The basis of the invention is that coil identification information is provided for magnetic resonance systems with exchangeable radio-frequency coils (also called "coil" below). This coil identification information is used in order to select the measurement protocols matching the coil automatically with the control device and to display only those protocols to the user on the display facility of the magnetic resonance system. For this purpose, the coil identification information is linked to the corresponding measurement protocols, as will be explained in detail below.

An incorrect selection of the measurement protocols is then possible only to a much more limited extent, and at least the accidental selection of a measurement protocol which is optimized for a very different coil type, is prevented.

The display of the selected measurement protocols can then, as is known and described for the prior art, be undertaken in tree views. The definition of a measurement protocol given at the start naturally also applies for the described invention.

It is noted once again that it is not the selection or the exclusion of measurement sequences per se that is involved, but of measurement protocols. In some cases the settings for measurement parameters differ significantly for different coils. I.e. that a measurement sequence with the incorrect measurement parameters, which result in significant SNR losses, should not be used, but of course the same measurement sequence with appropriate measurement parameters should be.

As a further selection criterion, examination region information and/or illness information can be used in order to select at least one measurement protocol as a function of the examination region information and/or illness information. Examination region information can be "head", "breast", "lung", etc., thus the examined part of the body is specified more or less. Illness information can be "cancer", "stroke", etc. This thus specifies the medical problem to be resolved. This additional information enables the number of displayed measurement protocols to be drastically reduced in some cases, so that only a small number of measurement protocols are still displayed. This supports the user in their choice of suitable protocols, in avoiding unnecessary and/or unsuitable measurements. Ultimately this leads to a far more efficient mode of operation.

The connected coil is thus a coil that is able to be placed in the magnetic field of the magnetic resonance system. In particular the coil is preferably a receive coil, i.e. that is arranged on the patient during an examination. In particular the coil is of course not one of the coils for creating the main magnetic field or the gradient fields. However this already emerges automatically from the remarks given above.

Preferably the coil identification information can be determined by the control computer after the connection of the at least one radio-frequency coil. As an alternative a selection window or input window can be displayed on the display device in which the coil identification information is able to be entered or selected. The provision of the coil identification information can thus be done automatically or by the user. To avoid incorrect entries it is preferred for the coil identification information to be read out automatically by the control device and thus without user input. The reduced user interaction also enhances convenience and accelerates the progress of the measurement.

The examination area information and/or illness information can also be provided by means of a selection window or input window. However it is also possible for the coil to be optimized for specific regions of the body and medical problems. This information can then also be contained in the coil identification information.

Preferably the radio-frequency coil can provide an identification code which is read out by the control device. This reading out takes place purely electrically via the connector. In a similar way to "plug and play" on a computer, the control device detects the connection of a radio-frequency coil and reads the identification code out as coil identification information. The identification code is preferably embodied as a series of numbers, wherein the position of the digits can stand for predetermined information. For example the digit at the first position can specify the type of coil such as "surface coil", "birdcage", "coil array" etc. The second digit can specify whether the coil is optimized for a region of the body.

This information can also be specified as combined information. In this case a number of digits are to be used as an information unit in any event. The digit sequence "15" can then stand for "head coil array", the digit sequence "16" for head coil, etc.

The identification code can also include a digit, especially, 0, which specifies that the coil does not have any particular type of purpose. For example some surface coils can be used on a number of parts of the body for examination. In this case the "0" means that there is no restriction present as to a specific part of the body.

The identification code can also be an alphabetic code or a combination of any given alphanumeric characters.

Advantageously the measurement protocols can be combined into measurement protocol groups and at least one measurement protocol group can be selected as a function of the coil identification information. For the same medical problems the same medical "workflows" are always to be performed. For knee measurements for example either a pure receive coil or a transmit and receive coil can be used. For each coil optimized measurement protocols are available. Depending on which coil is plugged into the connector, the associated measurement protocols are displayed.

All measurement protocols suitable for a radio-frequency coil can also be combined into a measurement protocol group.

The use of the measurement protocol groups especially facilitates the administration of the measurement protocols, since the allocations and releases can be made in groups and thus only have to be performed once.

Especially advantageously, depending on the coil identification information, at least one coil class can be selected and at least one measurement protocol or a measurement protocol group can be selected as a function of the coil class.

The coil identification information, as described, can be embodied in different ways. On the basis of the coil identification information the coil type, such as surface coil, birdcage coil etc., can be notified very generally. But it is also possible for further information to be included, e.g. surface head coil. In particular with the last-mentioned embodiment, it is sensible to use coil classes as an abstraction layer. The coil classes can increase or lower the level of restriction. For example the coil class "surface coils" can include all surface coils, be they surface coils for the abdomen, the breast, the head or the knee.

The coil classes and measurement protocol groups are then abstraction layers through which administration is significantly simplified.

Preferably the coils are divided into coil classes as a function of the B1 field that they create, especially the homogeneity of the B1 field. For transmit coils with inhomogeneous B1 fields measurement sequences and corresponding measurement protocols with small flip angles are preferred. If the coils are pure receive coils such a distinction is less relevant.

The selectable measurement protocols or the selectable measurement protocol groups can be predetermined by a configuration file. The configuration file in this case represents a first selection criterion. This can then be adapted for a specific customer. It is namely usually known which coils a customer possesses. Accordingly, only those protocols are usually able to be used for which coils are also present. Thus a pre-selection is able to be made in this way.

Especially advantageously, as a function of the coil identification information, a single measurement protocol group comprising a number of measurement protocols can be selected. This includes all measurement protocols relevant for the coil and if necessary the medical problem and optimized. As an alternative, as a function of the coil identification information, two measurement protocol groups can be selected, wherein the measurement protocols of a first measurement protocol group are shown on the display facility and the second measurement protocol group is shown by means of a measurement protocol group symbol and the measurement protocols of the second measurement protocol group are accessible via the measurement protocol group symbol. The second measurement protocol group contains measurement protocols for a similar coil type, wherein these measurement protocols are then the especially available for experimental measurements. For example, in addition to the measurement protocol group "head", of which the measurement protocols are displayed directly, the measurement protocol group "abdomen" can also be displayed as a button. A click or double-click on the corresponding button makes the measurement protocols of the measurement protocol group visible and retrievable. Thus measurement protocols likewise still able to be used can quickly be made accessible, without operability being restricted.

As described, the measurement protocol groups can also contain specific selections, e.g. only for flux measurements. Then a number of measurement protocol groups, which all contain optimized measurement protocols in each case, can be displayed for a coil.

Preferably the measurement protocols can be grouped together into measurement protocol groups depending on the $B_0$ or $B_1$ sensitivity. Each measurement protocol is based on a measurement sequence. Their sensitivities do not only depend on the sequence itself but partly also on the measurement parameters. Thus a FLASH sequence can also be used for tissues with air pockets, such as the lungs, if the echo time is minimized. Consequently the dependencies are in part coil-dependent, as described above, but also measurement-protocol-dependent. Thus a measurement-protocol-dependent grouping is also sensible.

Preferably the measurement protocols can be grouped together into measurement protocol groups as a function of the SAR value. SAR stands for "specific absorption rate" and specifies the absorbed energy. This is also measurement-protocol-dependent since inter alia the repetition time and the number and embodiments of the radio frequency pulses influence this value.

The object underlying the present invention is also achieved by a magnetic resonance system that has at least one radio-frequency coil connected to a connector as well as a control computer. The magnetic resonance system is characterized by the control computer being configured to execute the method as described above.

Preferably the radio-frequency coil is a surface coil, birdcage coil or coil array.

The method can be implemented in the control computer as software or as (hard-wired) hardware.

BRIEF DESCRIPTION OF THE DRAWINGS

FIG. 4 is a flowchart of a second embodiment of the method according to the invention.

FIG. 5 schematically illustrates an example of a display presentation that is shown at a display monitor, in accordance with the present invention.

DESCRIPTION OF THE PREFERRED EMBODIMENTS

Figure 1:
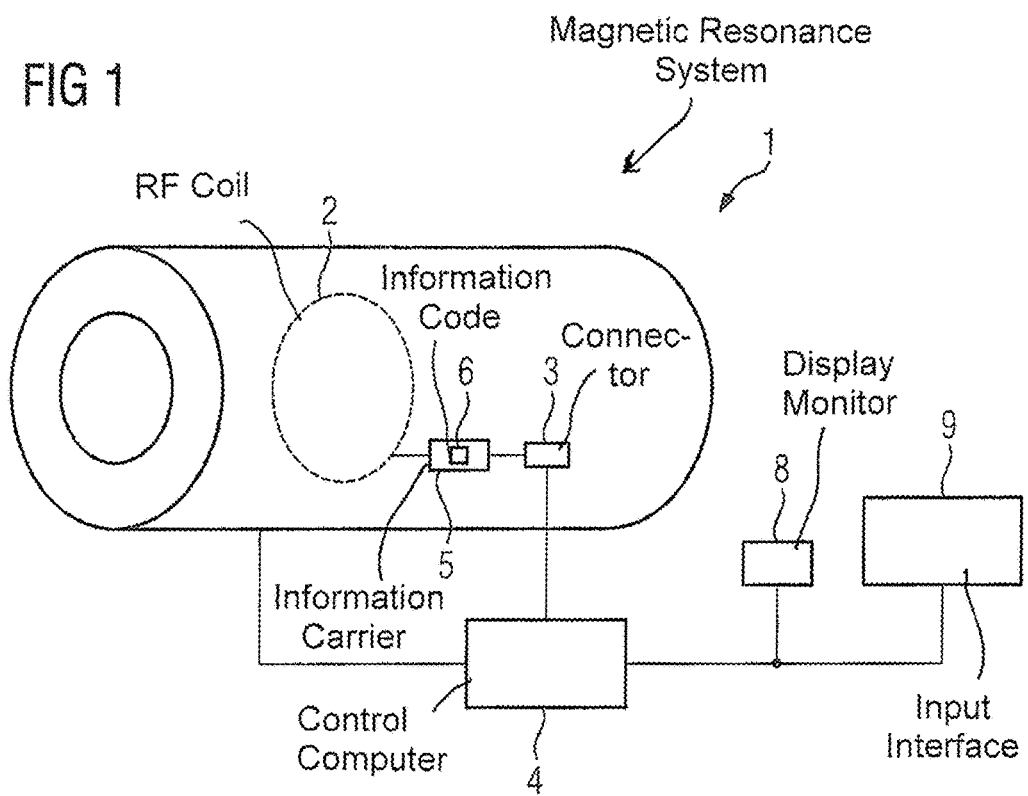
FIG. 1 schematically illustrates a magnetic resonance system.

FIG. 1 shows a magnetic resonance system 1 that has a scanner with at least one radio-frequency (RF) coil 2. The radio-frequency coil 2 is connected via a connector 3 to the control computer 4 that operates the scanner of magnetic resonance system 1, wherein the connector 3 makes an electrical connection possible. The connector 3 can be embodied as a plug-in connection. The connector 3 makes it possible to connect various radio-frequency coils 2 to the control computer 4. This diagram is naturally simplified, more elements than the connector 3 are of course located between the radio-frequency coil 2 and the control computer 4 of the magnetic resonance system 1. The connector is important since it allows the exchange of different radio-frequency coils 2.

The radio-frequency coil 2 has an information carrier 5, which bears an information code 6. This information code 6 is coil identification information. For example the identification code 6 consists of a sequence of digits such as the digits 124. In this case the first two digits "12" stand for a breast coil and the third digit "4" for breast cancer.

Furthermore a display monitor 8 and an input interface 9 are connected to the control device 4.

The described method is preferably implemented in software in the control computer 4.

Figure 2:
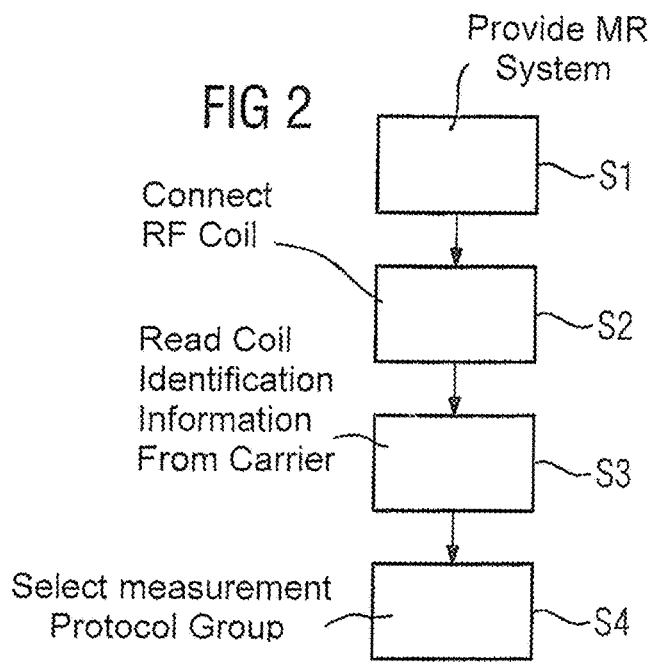
FIG. 2 is a flowchart of a first embodiment of the method according to the present invention.

FIG. 2 shows the method for operating the magnetic resonance system 1 as an execution scheme. In step S1 a magnetic resonance (MR) system 1 with a control computer 4 and a connector 3 is provided.

As step S2 a radio-frequency coil 2 is connected to the connector 3. After the connection of the radio-frequency coil 2 the control device 4, in step S3, reads coil identification information out from the radio-frequency coil 2.

Automated readout of the coil identification information can occur such that either a signal is transferred to the control computer 4 by the connector 3 that indicates the connection of a coil. As an alternative the control computer 4 can interrogate the connector 3 at predetermined intervals.

The control computer 4 can, for example, interrogate the radio-frequency coil 2 by the coil identification information being provided on the radio-frequency coil as an identification code. This can be done for example by a resistance coding or EEPROM.

As an alternative a number of connectors 3 can be provided, wherein coil arrays as radio-frequency coils 2 are able to be connected to a connector 3, surface coils to a second connector 3 and birdcage coils to a third connector 3. In this case the occupancy of a connector 3 provides coil identification information. This alternative applies for all embodiments of the described method and the magnetic resonance system 1.

The last-described alternative likewise comprises that, although only one connector 3 is present in or on the housing of the magnetic resonance system 1, an electrical connection, i.e. the cable following the connector 3, is re-plugged in the switching cabinet in accordance with the type of radio-frequency coil 2.

After the control computer 4 has read out or has received the coil identification information, as step S4 a measurement protocol group with a number of measurement protocols is selected.

Figure 3:
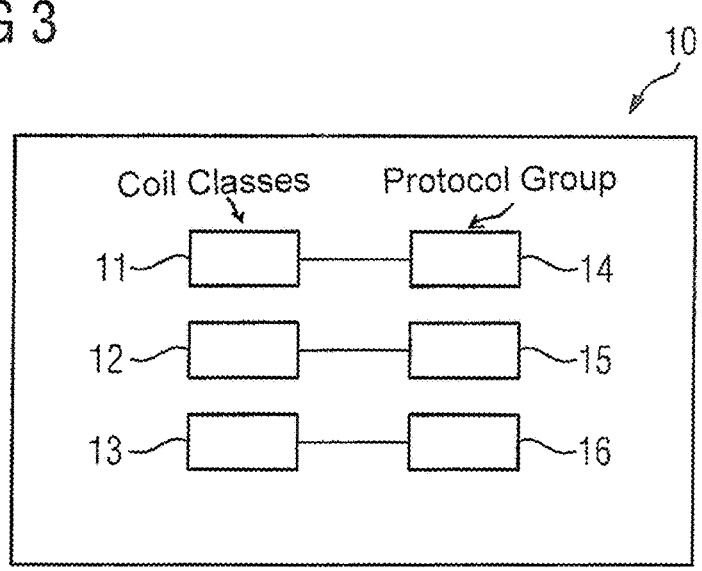
FIG. 3 schematically illustrates assignment of protocols in a protocol group to respective coil classes in accordance with the present invention.

This is done for example, as FIG. 3 shows, by using the table 10 as an assignment scheme, where a measurement protocol group 14, 15 or 16 is assigned to each coil or to each coil type.

A coil class 11, 12 or 13 can also be deduced from the coil identification information and in the table 10 a link can be made between coil classes 11, 12 or 13 and measurement protocol groups 14, 15 or 16.

In this case the number of abstraction steps on the coil side and the measurement protocol side is of no significance. In addition to measurement protocol groups there could also be measurement protocol supergroups, which combine a number of measurement protocol groups. Of importance for the invention is rather that at least one measurement protocol is able to be selected as a function of the coil identification information.

FIG. 4 shows an alternate execution scheme. In this scheme, unlike in FIG. 2, the described step S1 is followed, as step S5, by the entry of coil identification information by user. This occurs instead of or in addition to step S3. The input can be made before or after the connection of the radio-frequency coil 2 to the connector 3. The advantage of this alternative lies in the fact that it can be implemented purely as a software update and thus on existing magnetic resonance systems.

FIG. 5 shows the display screen of the display monitor (screen) 8, at which the measurement protocols 17, 18 and 19 of the measurement protocol group 14 are presented. The radio-frequency coil 2 belongs, in accordance with table 10, to coil class 11, wherein the selection runs in the reverse direction: In accordance with the coil identification information the radio-frequency coil 2 has been assigned to the coil class 11 and thus the measurement protocol group 14 is automatically selected by the control device 4.

In this way only those measurement protocols 17, 18 and 19 which have been optimized for use with the radio-frequency coil 2 are displayed to a user or made available for selection.

Since the measurement protocols 17, 18 and 19 may not be sufficient to perform all desired measurements, the button 20 is displayed in addition. The button 20 is selectable and, on activation, the measurement protocols of a further measurement protocol group, for example the measurement protocol group 15, are displayed. In this case a measurement protocol group for a coil class similar to coil class 11 can be involved or a measurement protocol group with standard measurement protocols and standard parameters. Naturally it is also possible for more measurement protocol groups than the measurement protocol group 15 to be made accessible via buttons.

Although modifications and changes may be suggested by those skilled in the art, it is the intention of the inventor to embody within the patent warranted hereon all changes and modifications as reasonably and properly come within the scope of her contribution to the art.

I claim as my invention:

1. A method for operating a magnetic resonance apparatus comprising a magnetic resonance scanner having a radio-frequency coil and a connector that connects the radio-frequency coil to a control computer that operates the magnetic resonance scanner, said control computer comprising a display interface, said method comprising:

connecting a radio-frequency coil to said connector;
providing said computer with at least one item of coil identification information that identifies said radio-frequency coil connected to said connector;
in said control computer, automatically selecting at least one existing measurement protocol, as a selected protocol, for operating said magnetic resonance scanner, from among a plurality of different existing measurement protocols, for acquiring magnetic resonance data using the connected radio-frequency coil and, in said control computer, making said selection dependent on said at least one item of coil identification information; and
in said control computer, generating control signals corresponding to the selected protocol, and providing said control signals to said magnetic resonance scanner in order to operate said magnetic resonance scanner so as to execute said selected protocol and thereby acquire magnetic resonance data from a subject, and making the acquired MR data available from the computer in electronic form.

2. A method as claimed in claim 1 comprising automatically detecting said coil identification information upon connection of said at least one radio-frequency coil to said connector.

3. A method as claimed in claim 2 comprising embodying said at least one item of coil information as a machine-readable identification code on a carrier that is fixedly associated with said radio-frequency coil, and automatically reading said code into said control computer.

4. A method as claimed in claim 1 comprising displaying a window at said display interface, and receiving a manually entered designation, via said window, into said control computer of said at least one item of coil identification information.

5. A method as claimed in claim 1 comprising organizing said measurement protocols into respective measurement protocol groups, and selecting at least one measurement protocol group dependent on said coil identification information.

6. A method as claimed in claim 5 comprising organizing different radio-frequency coils into a coil class, and selecting one of said coil classes, dependent on said coil identification information, together with at least one measurement protocol group associated with said coil class.

7. A method as claimed in claim 6 comprising organizing said different radio-frequency coils into respective coil classes dependent on a radio-frequency field emitted by the respective radio-frequency coils.

8. A method as claimed in claim 7 comprising organizing said radio-frequency coils into said classes dependent on a homogeneity of said field.

9. A method as claimed in claim 1 comprising organizing different radio-frequency coils into a coil class, and selecting one of said coil classes, dependent on said coil identification information, together with at least one measurement protocol associated with said coil class.

10. A method as claimed in claim 1 comprising specifying said measurement protocols in a configuration file provided to said control computer.

11. A method as claimed in claim 1 comprising organizing said measurement protocols into respective measurement protocol groups, and selecting at least one measurement protocol group dependent on said coil identification information, and selecting a single measurement protocol group, comprising a plurality of measurement protocols, dependent on said coil identification information.

12. A method as claimed in claim 1 comprising organizing said measurement protocols into respective measurement protocol groups, and selecting at least one measurement protocol group dependent on said coil identification information, and selecting two measurement protocol groups dependent on said coil identification information, and presenting said two selected measurement protocol groups at said display interface, with measurement protocols of a first of said two measurement protocol groups and the measurement protocols of a second of said two measurement protocol groups being respectively represented as measurement protocol group symbols, and selecting one of said two measurement protocol groups by user interaction with the respective symbol thereof.

13. A method as claimed in claim 12 comprising grouping said measurement protocols into at least said two measurement protocol groups dependent on sensitivity thereof to at least one of a basic magnetic field generated by said magnetic resonance scanner, and a radio-frequency field emitted by said radio-frequency coil.

14. A method as claimed in claim 13 comprising selecting said at least two measurement protocol groups dependent on an expected specific absorption rate value associated therewith.

15. A magnetic resonance apparatus comprising:
a magnetic resonance scanner comprising a radio-frequency coil and a connector said radio-frequency coil being selectively connected to said connector;
a control computer connected to said radio-frequency coil via said connector;
said computer being provided with at least one item of coil identification information that identifies said radio-frequency coil connected to said connector;
said control computer being configured to automatically select at least one existing measurement protocol, as a selected protocol, for operating said magnetic resonance scanner, from among a plurality of different existing measurement protocols, for acquiring magnetic resonance data using the connected radio-frequency coil, and to make said selection dependent on said at least one item of coil identification information; and
in said control computer, generating control signals corresponding to the selected protocol, and providing said control signals to said magnetic resonance scanner in order to operate said magnetic resonance scanner so as to execute said selected protocol and thereby acquire magnetic resonance data from a subject, and making the acquired MR data available from the computer in electronic form.

16. A magnetic resonance apparatus as claimed in claim 15 wherein said radio-frequency coil is selected from the group consisting of surface coils, birdcage coils, and coil arrays.

17. A magnetic resonance apparatus as claimed in claim 15 comprising an information carrier fixedly associated with said radio-frequency coil, said information carrier comprising machine-readable information embodying said at least one item of coil information, and wherein said control computer is configured to receive said machine-readable information automatically.

\* \* \* \* \*